US006508154B1

(12) United States Patent
Tripard

(10) Patent No.: US 6,508,154 B1
(45) Date of Patent: Jan. 21, 2003

(54) INTEGRATED CIRCUIT PACKAGE SEPARATORS

(75) Inventor: Jason E. Tripard, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 09/687,601

(22) Filed: Oct. 12, 2000

Related U.S. Application Data

(62) Division of application No. 09/533,058, filed on Mar. 22, 2000, which is a division of application No. 09/176,479, filed on Oct. 20, 1998, now Pat. No. 6,277,671.

(51) Int. Cl.⁷ .................................. B26D 7/02
(52) U.S. Cl. .................. 83/467.1; 83/468.5; 83/929.1; 83/953
(58) Field of Search .................. 83/451, 467.1, 83/468.5, 468.6, 56, 614, 929.1, 939, 953; 269/54.5, 54.1, 295

(56) References Cited

U.S. PATENT DOCUMENTS

| | | | | |
|---|---|---|---|---|
| 154,694 A | * | 9/1874 | Martin | 269/54.5 |
| 1,275,899 A | * | 8/1918 | Freydberg | 269/295 |
| 1,379,724 A | * | 5/1921 | Russell | 83/451 |
| 2,305,339 A | * | 12/1942 | Deutscher | 83/614 |
| 2,373,968 A | | 4/1945 | Lang | 269/54.5 |
| 3,905,100 A | * | 9/1975 | Kleine et al. | 269/295 |
| 3,976,288 A | * | 8/1976 | Cuomo, Jr. | 269/291 |
| 4,497,477 A | * | 2/1985 | Abel | 269/303 |
| 4,807,504 A | | 2/1989 | Vandermarliere | |
| 4,822,015 A | | 4/1989 | Glasman et al. | |
| 4,832,323 A | * | 5/1989 | Principe et al. | 269/54.5 |
| 4,930,759 A | * | 6/1990 | Potter et al. | 269/54.5 |
| 5,063,800 A | | 11/1991 | Pieroni | |
| 5,067,695 A | * | 11/1991 | Huddleston | 269/21 |
| 5,144,873 A | * | 9/1992 | Nasu | 269/54.5 |
| 5,173,766 A | | 12/1992 | Long et al. | |
| 5,218,753 A | * | 6/1993 | Suzuki et al. | 29/740 |
| 5,288,061 A | | 2/1994 | Pieroni | |
| 5,438,740 A | * | 8/1995 | Carr et al. | 198/345.3 |
| 5,794,329 A | * | 8/1998 | Rossmeisl et al. | 29/703 |
| 5,839,337 A | * | 11/1998 | Neu | 83/614 |
| 5,970,606 A | | 10/1999 | Beuchele | |
| 5,984,293 A | * | 11/1999 | Abrahamson et al. | 269/236 |
| 6,150,240 A | * | 11/2000 | Lee et al. | 438/460 |

* cited by examiner

Primary Examiner—Allan N. Shoap
Assistant Examiner—Stephen Choi
(74) Attorney, Agent, or Firm—Wells St. John P.S.

(57) ABSTRACT

A base having a plurality of pins extending upwardly therefrom is provided. A support is provided over the base. The support has an upper surface and a plurality of holes extending therethrough. The pins extend through the holes and upwardly beyond the upper surface of the support. An actuator is provided beneath the support. A board having a plurality of integrated circuits bonded thereto is provided. The integrated circuits form a repeating pattern of integrated circuit packages across the board, and the board has a plurality of holes extending through it. The board is placed over the support upper surface with the pins extending into the holes in the board. While the board is over the support upper surface, it is cut to separate the integrated circuit packages from one another.

21 Claims, 6 Drawing Sheets

INTEGRATED CIRCUIT PACKAGE SEPARATORS

RELATED PATENT DATA

This patent resulted from a divisional application of U.S. patent application Ser. No. 09/533,058, filed Mar. 22, 2000, and titled "Integrated Circuit Package Separators", which is a divisional application of U.S. patent application Ser. No. 09/176,479, which was filed on Oct. 20, 1998 now U.S. Pat. No. 6,277,671.

TECHNICAL FIELD

The invention pertains to methods of forming integrated circuit packages, as well as to devices for separating integrated circuit packages.

BACKGROUND OF THE INVENTION

Circuit constructions having integrated circuit (IC) chips bonded to circuit boards (such as SIMMs and DIMMs) can be fabricated by joining IC chips on a single large circuit board comprising a plurality of the constructions. The circuit board can be subsequently cut to separate discrete constructions from one another. The discrete constructions are referred to herein as integrated circuit packages. The smaller the individual circuit packages, the more likely it is for industry processing to utilize the above-described method of forming the packages on a single large board and subsequently cutting individual packages from the board.

An exemplary prior art process of separating integrated circuit packages is described with reference to FIG. 1. FIG. 1 illustrates a board assembly 10 having a plurality of IC chips 12 (only some of which are labeled) bonded thereto. Chips 12 are aligned into individual IC package configurations 14 (only some of which are labeled) to form a repeating pattern of integrated circuit packages 14 across the board assembly 10. Dashed lines 16 are shown to illustrate the boundaries between individual IC packages 14. In the shown exemplary embodiment, assembly 10 comprises three separate circuit boards 11, 13 and 15. The number and size of individual circuit boards can vary depending on the number and size of IC packages that are ultimately to be formed.

Each of boards 11, 13 and 15 comprises a pair of lateral waste sections 21, 23 and 25, respectively. The lateral waste sections 21, 23 and 25 are separated from the remainder of boards 11, 13 and 15, respectively, by imaginary dashed lines 20, 22 and 24. In further processing, the individual IC packages 14 are separated from one another by cutting through boards 11, 13 and 15 along the regions illustrated by dashed lines 16. During the cutting to separate IC packages 14 from one another, boards 11, 13 and 15 are also cut along regions illustrated by dashed lines 20, 22 and 24 to remove waste portions 21, 23 and 25 from the lateral sides of the boards, and accordingly from lateral edges of the ultimately formed IC packages.

Orifices 19 (only some of which are labeled) are provided throughout circuit boards 11, 13 and 15. Specifically, pairs of orifices 19 are provided in each IC package 14, and at least two orifices 19 are provided in each of waste portions 21, 23 and 25.

FIG. 1 further illustrates an IC package separator 40 comprising a cutting mechanism 42 (shown schematically as a cutting wheel, although other cutting mechanisms, such as, for example, router bits or linear blades, are known to persons of ordinary skill in the art), a retaining table 44, and a control mechanism 45 configured to control orientation of cutting wheel 42 relative to table 44. Retaining table 44 can comprise, for example, an x-y table (i.e., a table horizontally adjustable S in x and y directions; an "X", "Y" and "Z" axis system is illustrate in a lower corner of FIG. 1). Control mechanism 45 can control the x and y orientation of table 44 and the z (i.e., vertical) orientation of cutting mechanism 42 to precisely cut a board retained on table 44. Table 44, cutting mechanism 42, and control mechanism 45 can be comprised by commercially available cutting systems, such as, for example, Advanced Technology Incorporated's CM101 single spindle router (or, more generally, a circuit board depanelization router).

FIG. 1 also illustrates that table 44 comprises an upper platform 46. A subplate 48 is provided over platform 46, and a stripper plate 50 is provided over subplate 48. Subplate 48 comprises a plurality of upwardly extending pins 60 (only some of which are labeled), and stripper plate 50 comprises a number of orifices 62 configured to slide over pins 60. Subplate 48 is retained on table 44 by downwardly extending pins (not shown) which are aligned with and precisely received within orifices (not shown) extending within platform 46 of table 44.

Orifices 19 of boards 11, 13 and 15 align with pins 60. In operation, boards 11, 13 and 15 are slid over pins 60 until the pins protrude through orifices 19. Typically, orifices 19 are only about 0.003 inches wider than pins 60 to insure tight alignment of boards 11, 13 and 15 with subplate 48. After boards 11, 13 and 15 are retained on table 44 by pins 60, cutting mechanism 42 is utilized to cut along the regions illustrated by dashed lines 16, 20, 22 and 24. Such cutting separates discrete integrated circuit packages 14 from one another, as well as from waste regions 21, 23 and 25. The separated circuit packages are retained on table 44 by pins 60 extending through the packages. Specifically, each of individual packages 14 comprises a pair of orifices 19 and is thereby retained on table 44 by a pair of pins 60.

After the IC packages are separated from one another, stripper plate 50 is manually lifted off of subplate 42 to lift the IC packages 14 from pins 60. Once stripper plate 50 is lifted off from pins 60, the individual IC packages can be separated from stripper plate 50. An exemplary method of removing the IC packages from stripper plate 50 is to tilt plate 50 and allow the packages to slide off plate 50. After the packages 14 are removed, plate 50 can be returned to over 48 and used again for separating IC packages.

Difficulties can occur in utilizing the assembly of FIG. 1 for separating IC packages. For instance, separated IC packages can be broken as stripper plate 50 is lifted from subplate 48. It would be desirable to reduce or eliminate such problems.

SUMMARY OF THE INVENTION

In one aspect, the invention encompasses a method of forming integrated circuit packages. A base having a plurality of pins extending upwardly therefrom is provided. A support is provided over the base. The support has an upper surface and a plurality of holes extending therethrough. The pins extend through the holes and upwardly beyond the upper surface of the support. An actuator is provided beneath the support. A board having a plurality of integrated circuits bonded thereto is provided. The integrated circuits form a repeating pattern of integrated circuit packages across the board, and the board has a plurality of holes extending through it. The board is placed over the support upper surface with the pins extending into the holes in the board. While the board is over the support upper surface, it is cut to separate the integrated circuit packages from one another. After the cutting, the support is vertically displaced by the actuator to lift the support off the pins.

In another aspect, the invention encompasses an integrated circuit package separator for separating integrated circuit packages from a board. The board comprises a plurality of integrated circuits bonded thereto, and has a plurality of holes extending within it. The separator includes a base having a plurality of pins extending upwardly therefrom and a support over the base. The support has an upper surface, a plurality of holes extending therethrough, and a pair of opposing ends. The pins extend through the holes in the support and upwardly beyond the upper surface of the support. The support and pins are configured such that the pins extend into the holes in the board when the board is placed over the support upper planar surface. The separator further includes a pair of actuators beneath the support and configured to vertically displace the support and lift the support off the pins. Additionally, the separator includes a cutting mechanism configured to cut the board while the board is over the support upper planar surface and thereby separate the integrated circuit packages from one another.

BRIEF DESCRIPTION OF THE DRAWINGS

Preferred embodiments of the invention are described below with reference to the following accompanying drawings.

DETAILED DESCRIPTION OF THE PREFERRED EMBODIMENTS

This disclosure of the invention is submitted in furtherance of the constitutional purposes of the U.S. Patent Laws "to promote the progress of science and useful arts" (Article 1, Section 8).

An IC package separator of the present invention and a method of operation of such separator are described below with reference to FIGS. 2–6. In referring to FIGS. 2–6, similar numbering to that utilized above in describing prior art FIG. 1 will be used, with differences indicated by the suffix "a" or by different numerals.

Figure 1:
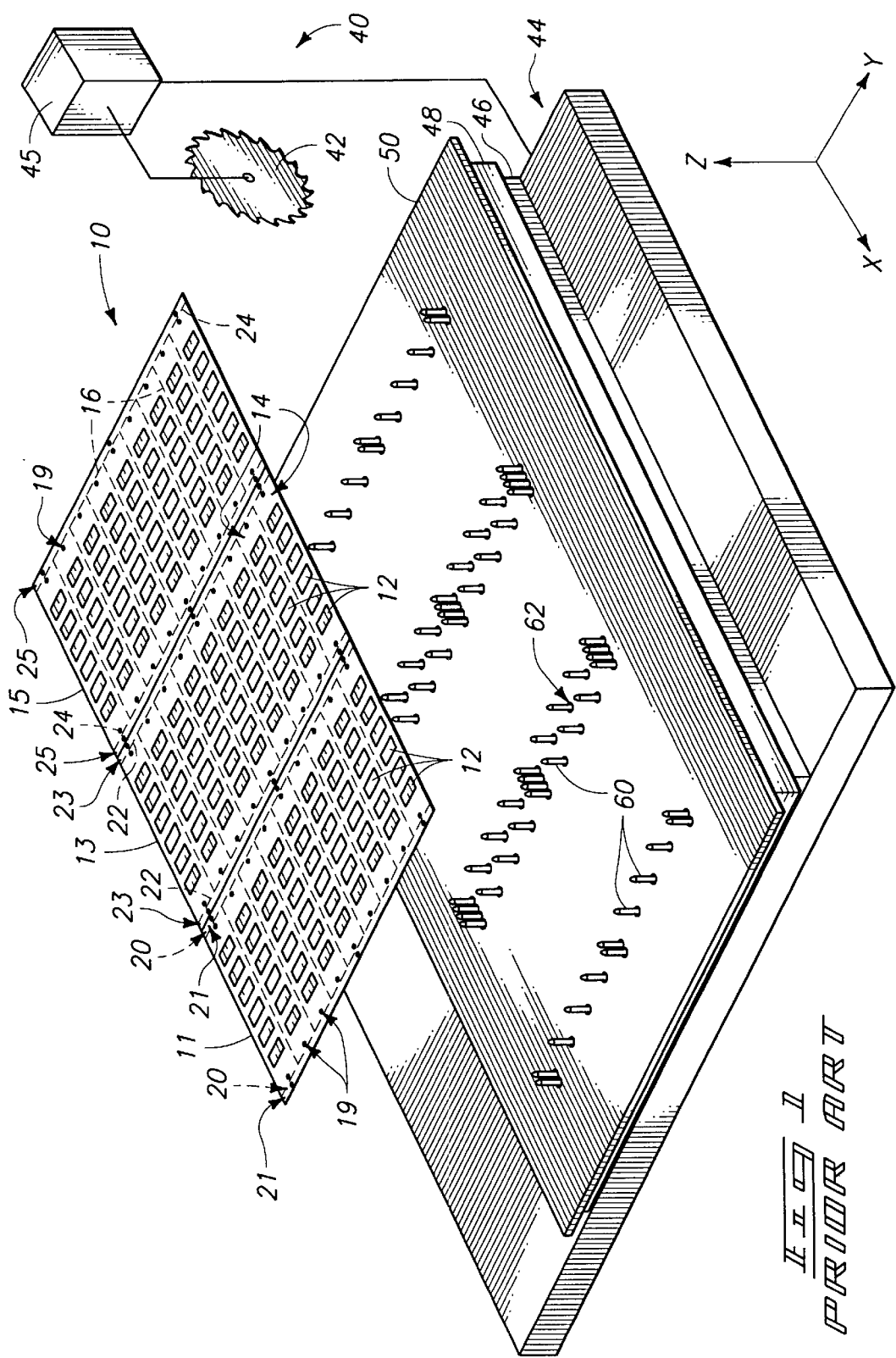
FIG. 1 is a diagrammatic, perspective, exploded view of a prior art IC package separator and circuit board assembly.
Figure 2:
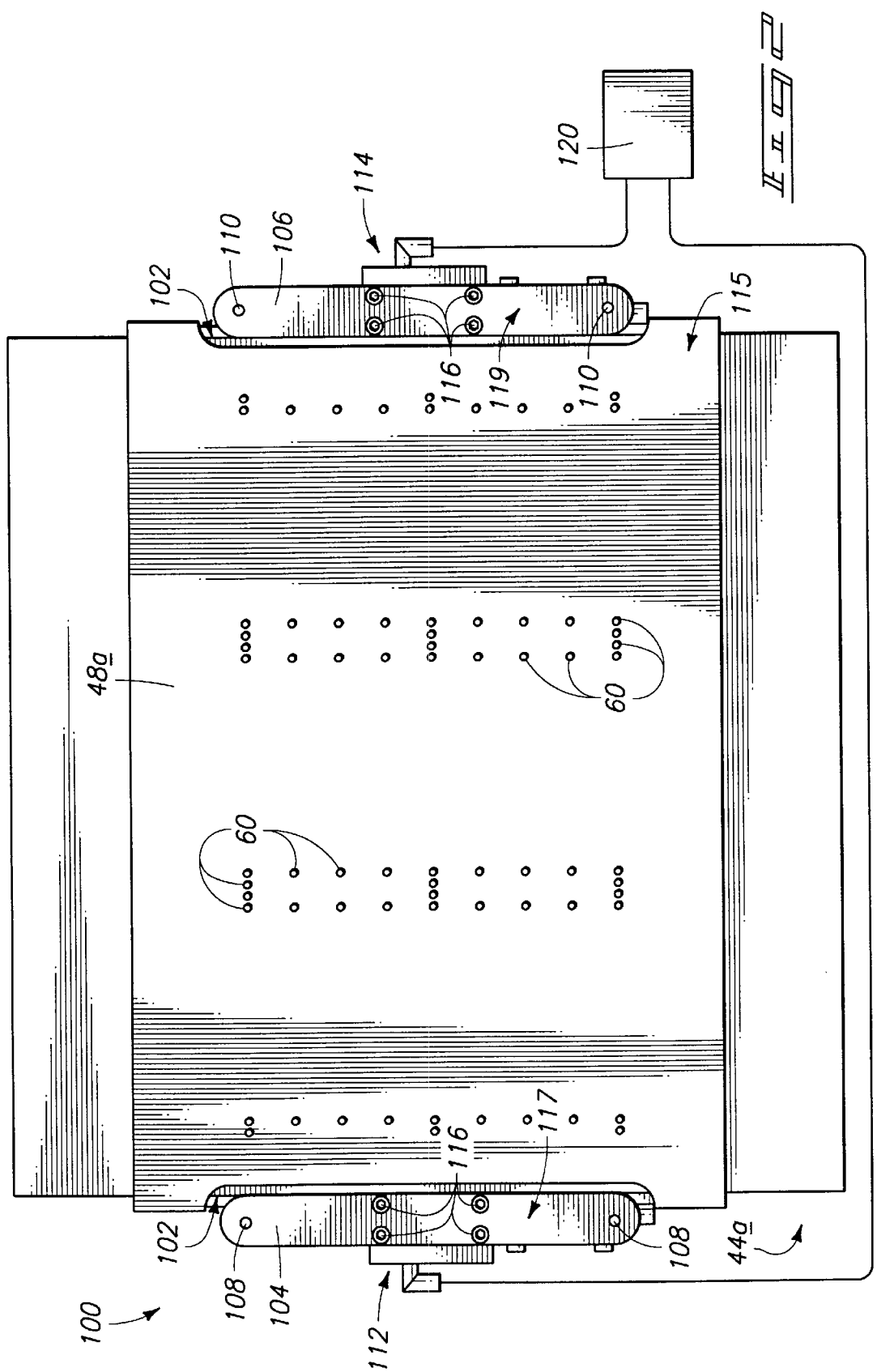
FIG. 2 is a diagrammatic top view of an IC package separator of the present invention.

Referring to FIG. 2, a separator 100 of the present invention is shown in top view. Separator 100 comprises a table 44a and a subplate 48a provided over table 44a. Table 44a can comprise, for example, an x-y table similar to the table 44 described above with reference to FIG. 1. Subplate 48a, like the above-described substrate 48 of FIG. 1, can be joined to table 44a through a plurality of downwardly extending pins (not shown), and comprises a plurality of upwardly extending pins 60 (only some of which are labeled) configured to retain a circuit board assembly (not shown).

Subplate 48a differs from subplate 48 of FIG. 1 in that subplate 48a comprises notches 102 at its ends. Notches 102 are provided to allow room for a pair of forcer plates 104 and 106 to move vertically (in and out of the page of FIG. 2) relative to table 48a. Forcer plates 104 and 106 comprise upwardly extending pins 108 and 110, respectively. Base plate 48a comprises an upper planar surface 115, and forcer plates 104 and 106 comprise upper planar surfaces 117 and 119, respectively. Upper planar surfaces 115, 117 and 119 ultimately support a circuit board assembly (not shown in FIG. 2). Planar surfaces 115, 117 and 119 are preferably substantially coplanar with one another to avoid distorting (e.g., bending) a supported circuit board assembly.

Forcer plates 104 and 106 are connected to actuators 112 and 114, respectively, configured to vertically displace forcer plates 104 and 106. In the exemplary shown embodiment, forcer plates 104 and 106 are connected to the actuators with screws 116. It is to be understood, however, that other mechanisms could be utilized for joining forcer plates 104 and 106 to actuators 112 and 114, including, for example, welding.

Actuators 112 and 114 are pneumatic (preferably air-powered) and connected to a gas source 120. An advantage of utilizing air powered actuators is that most wafer fabrication plants have a source of clean dry air available. Accordingly, it is relatively convenient to couple air powered actuators 112 and 114 into existing fabrication plants by simply connecting them to existing air lines. However, it is to be understood that the actuators can be powered by other sources besides air, including, for example, other fluids, such as liquids, as well as non-pneumatic and non-hydraulic sources, such as, for example, electricity.

Separator apparatus 100 comprises a cutting assembly (not shown in FIG. 2) and a controller (not shown in FIG. 2), analogous to the cutting assembly 42 and controller 45 of FIG. 1.

Figure 3:
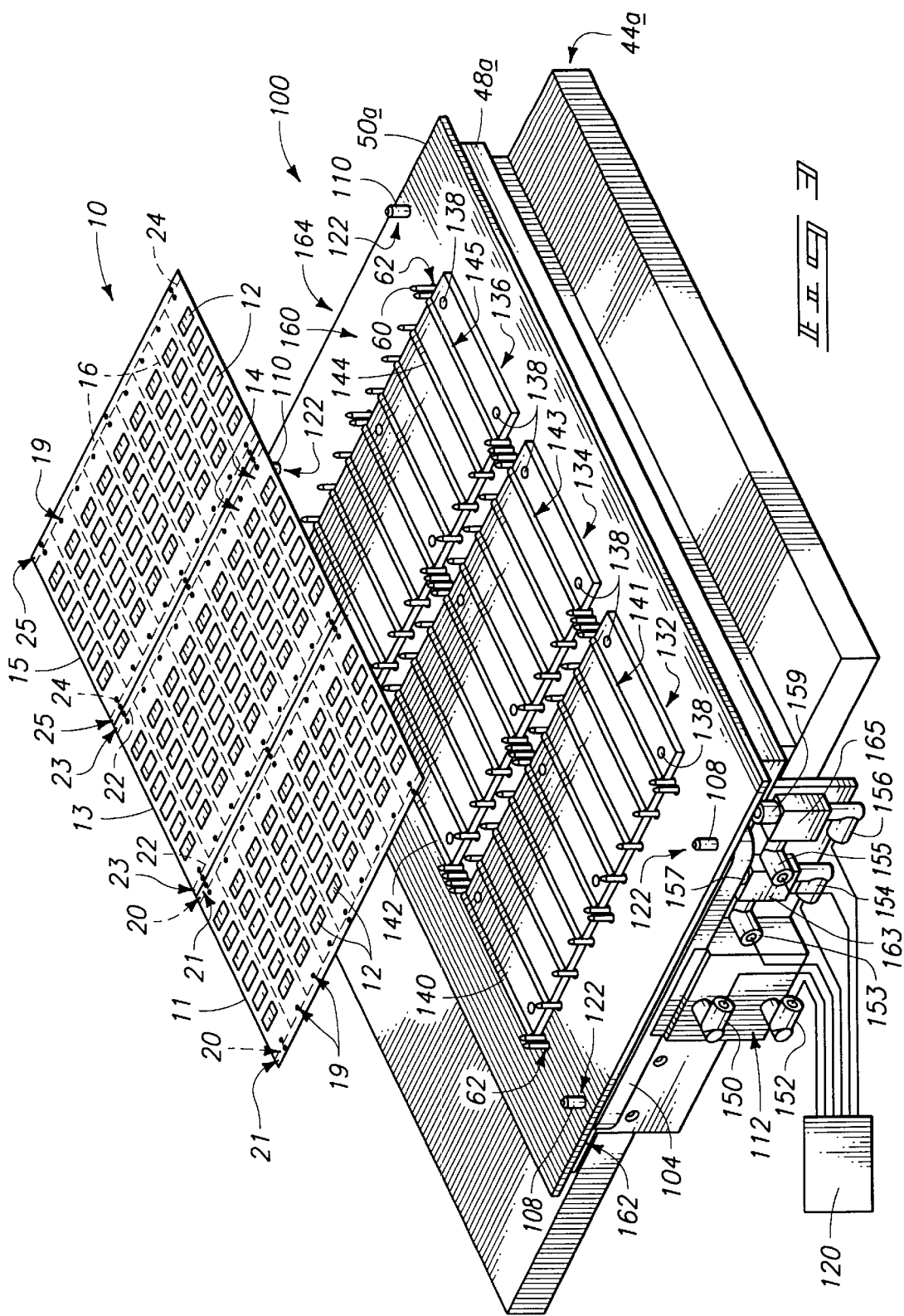
FIG. 3 is a diagrammatic, perspective, exploded view of an IC package separator of the present invention with a stripper plate of the present invention and a circuit board.

Referring to FIG. 3, IC circuit package separator 100 is shown in exploded view with a circuit board assembly 10 identical to the assembly described above with reference to FIG. 1.

A stripper plate 50a is provided between subplate 48a and circuit board assembly 10. Stripper plate 50a is similar to the stripper plate 50 of FIG. 1 in that plate 50a comprises a plurality of orifices 62 configured for receipt of pins 60. However, stripper plate 50a differs from plate 50 of FIG. 1 in that plate 50a also comprises orifices 122 configured for receipt of upwardly extending pins 108 and 110 of forcer plates 104 and 106. Pins 108 and 110 are preferably tapered pins, such as can be obtained from McMaster-Carr. Exemplary pins have a dimension of 0.248 inches at base, 0.2324 inches at top, and a length of 0.75 inches. The taper of the pins can assist in aligning support 50a over the pins during placement of support 50a onto base 48a.

Stripper plate 50a further differs from plate 50 of FIG. 1 in that plate 50a is configured for receipt of a series of panels 132, 134 and 136. Stripper plate 50a can comprise, for example, static-reduced plastic having a thickness of greater than 3/16 inches, and panels 132, 134 and 136 can comprise, for example, aluminum. In the shown embodiment, panels 132, 134 and 136 are held to stripper plate 50a by a plurality of screws 138 (only some of which are labeled). It will be recognized, however, that other mechanisms can be utilized for holding panels 132, 134 and 136 to stripper plate 50a, including riveting. Alternatively, panels 132, 134 and 136 can be molded as part of stripper plate 50a.

Panels 132, 134 and 136 comprise ribs 140, 142 and 144, respectively (only some of which are labeled). Ribs 140, 142 and 144 can assist in supporting board assembly 10. Specifically, IC chips 12 are frequently provided on both an upper surface of circuit board assembly 10, and a bottom surface (not shown). Ribs 140, 142 and 144 (also referred to as blocks) have upper surfaces 141, 143 and 145, respectively, which contact the bottom surfaces of circuit boards 11, 13 and 15 at locations between the IC chips 12 on the bottom of the board. Preferably, such upper surfaces are provided at a height approximately equal to a thickness of integrated circuit chip components 12. Accordingly, when boards 11, 13 and 15 are rested on panels 132, 134 and 136, respectively, the boards rest on the upper surfaces of blocks 140, 142 and 144 while leaving integrated circuit chip components on the underside of boards 11, 13 and 15 extending between block upper surfaces 141, 143 and 145 and panels 132, 134 and 136. An exemplary block height (or thickness) of blocks 140, 142 and 144 for a DRAM having IC chips 12 with a TSOP dimensional package is 0.040 inches ±0.005 inches. As another example, if IC chips 12 have a SOJ dimensional package, the block height is preferably 0.140 inches ±0.005 inches.

Blocks 140, 142 and 144 can be formed as one piece with panels 132, 134 and 136. Alternatively, blocks 140, 142 and 144 can be formed as discrete pieces from panels 132, 134 and 136 that are subsequently fastened to the panels.

In the shown embodiment, blocks 140, 142 and 144 are provided in a one-to-one correspondence with integrated chip packages 14. Also, is in the shown exemplary embodiment each of panels 132, 134 and 136 is identical to one another, and in a one-to-one correspondence with individual boards 11, 13 and 15. It is to be understood, however, that the invention encompasses other embodiments (not shown) wherein the blocks are not provided in a one-to-one correspondence with packages 14, wherein the panels are not identical to one another, and wherein the panels are not in a one-to-one correspondence with the individual boards.

Pins 60 extend upwardly beyond upper surfaces 141, 143 and 145 of blocks 140, 142 and 144, and are configured to retain circuit board assembly 10 over stripper panel 50*a*. In the shown embodiment, pins 60 do not extend through panels 132, 134 and 136. However, it is to be understood that the invention encompasses other embodiments wherein pins 60 do extend through such panels.

FIG. 3 shows a side perspective view of actuator 112. In such view it can be seen that several ports 150, 152, 153, 154. 155 and 156 are provided between actuator 112 and gas source. 120. Valves (not shown) are provided between source 120 and one or more of ports 150, 152, 153, 154, 155 and 156. Such valves enable fluid to be selectively flowed from source 120 into one or more of ports 150, 152, 153, 154, 155 and 156 to selectively control raising and lowering of forcer plate 104 with actuator 112. For instance, flow of gas into port 152 can force a pneumatic cylinder to lift forcer plate 104, and flow of gas into port 150 can force the pneumatic cylinder to lower forcer plate 104.

Ports 154 and 156 are connected to release valves 163 and 165, respectively, which enable a pressure on at least one side of the pneumatic cylinder of actuator 112 to be maintained at ambient pressure (generally, about 1 atmosphere). Specifically, release valves 163 and 165 comprise outlet ports 157 and 159, respectively, which vent to a surrounding environment. Persons of ordinary skill in the art will recognize that one or more of ports 150, 157 and 159 are utilized as gas outlet ports during lifting of forcer plate 104, and port 152 comprises a gas inlet port during such lifting. In preferred embodiments of the present invention, the release valves are associated with an outlet side of actuator 112 to enable equilibration of a pressure at such outlet side to ambient prior to (and/or during) lifting of forcer plate 104. Specifically, the release valves enable gas to be drained from outlet lines (more specifically, the gas is drained through ports 157 and 159 which are open to ambient conditions) prior to, and/or during, lifting with the actuator. Actuator 114 (FIG. 2) is preferably identical to actuator 112 and connected to an identical valve and port assembly as that shown connected to actuator 112. Accordingly, actuator 114 is also connected with release valves configured to equilibrate a back-pressure of the actuator to ambient prior to, and/or during, lifting of stripper panel 50*a*. The equilibration of pressure at the outlet ends of both of actuators 112 and 114 to ambient during a lifting operation can enable both actuators to have an identical back-pressure during the lifting operation. This can facilitate having both actuators lift simultaneously and in unison. Such simultaneous lifting can avoid distortion (such as, for example, bending) of circuit board assembly 10 during the lifting.

Stripper plate 50a has an upper planar surface 160 and a pair of opposing ends 162 and 164. Opposing ends 162 and 164 overlie forcer plates 104 and 106, respectively. In operation, actuators 112 and 114 are utilized to lift opposing ends 162 and 164 simultaneously and in unison. Such can be accomplished by, for example, maintaining approximately equal gas pressure at both of actuators 112 and 114 during lifting, and is found to reduce breakage of integrated circuit packages relative to prior art methods. The term "approximately" in the previous sentence is utilized to indicate the gas pressure at both actuators is equal within operational parameters.

Figure 4:
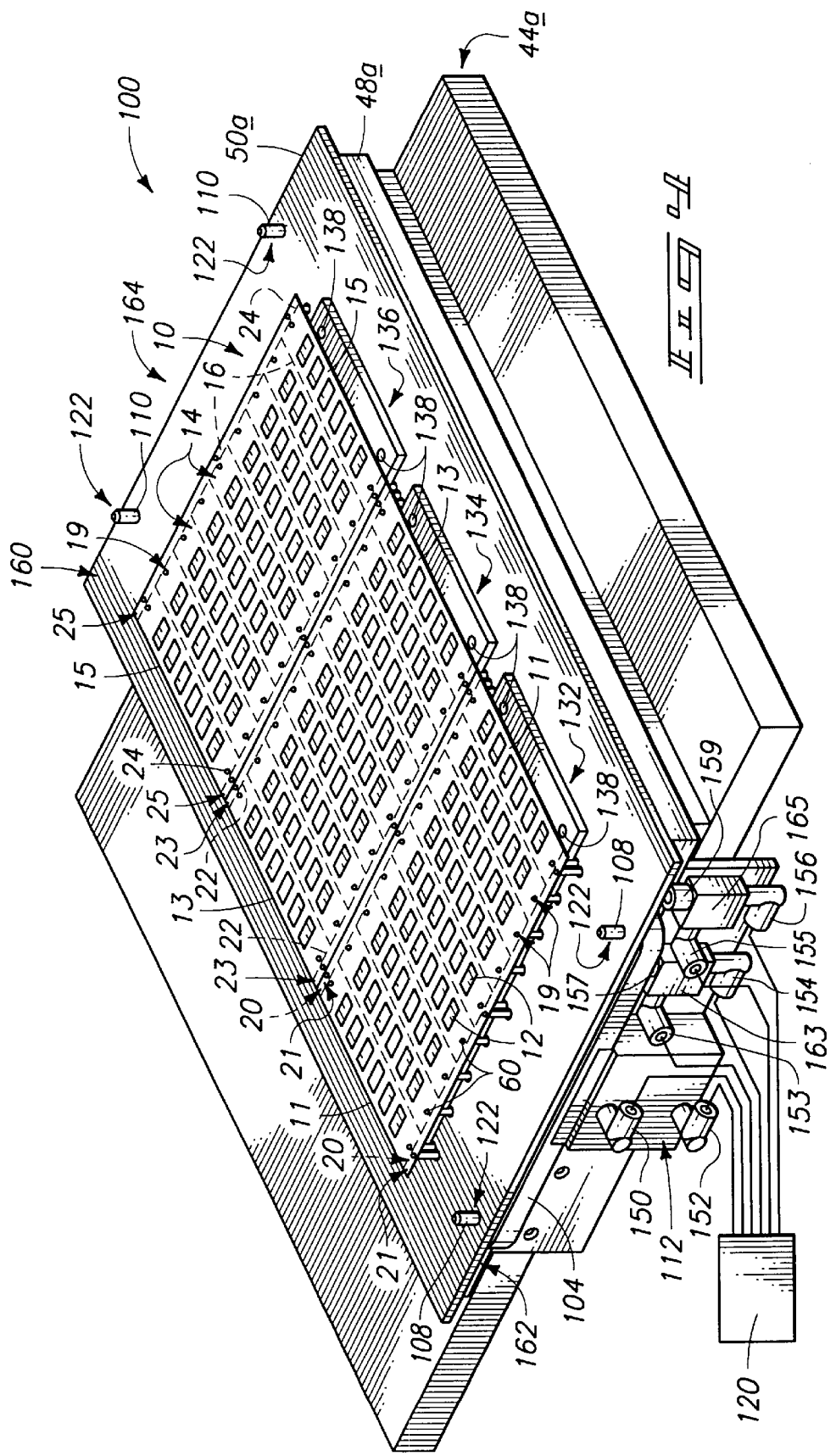
FIG. 4 is a view of the FIG. 3 assembly with the circuit board retained on the IC separator.

A method of operation of separator 100 is described with reference to FIGS. 4–6. In referring to FIGS. 4–6, subplate 48*a* is referred to as a base, and stripper plate 50*a* is referred to as a support. Referring first to FIG. 4, circuit board assembly 10 is shown retained on support 50*a*. Specifically, circuit board assembly 10 is placed over support upper surface 160 with pins 60 extending through orifices 19 of the circuit boards 11, 13 and 15. Pins 60 and board assembly 10 are aligned such that each of the integrated circuit packages 14 is retained to the support 50*a* by at least one pin, and, in the shown embodiment, is retained by 2 pins. In the FIG. 4 processing step, actuators 112 and 114 (FIG. 2) are in a lowered position.

Figure 5:
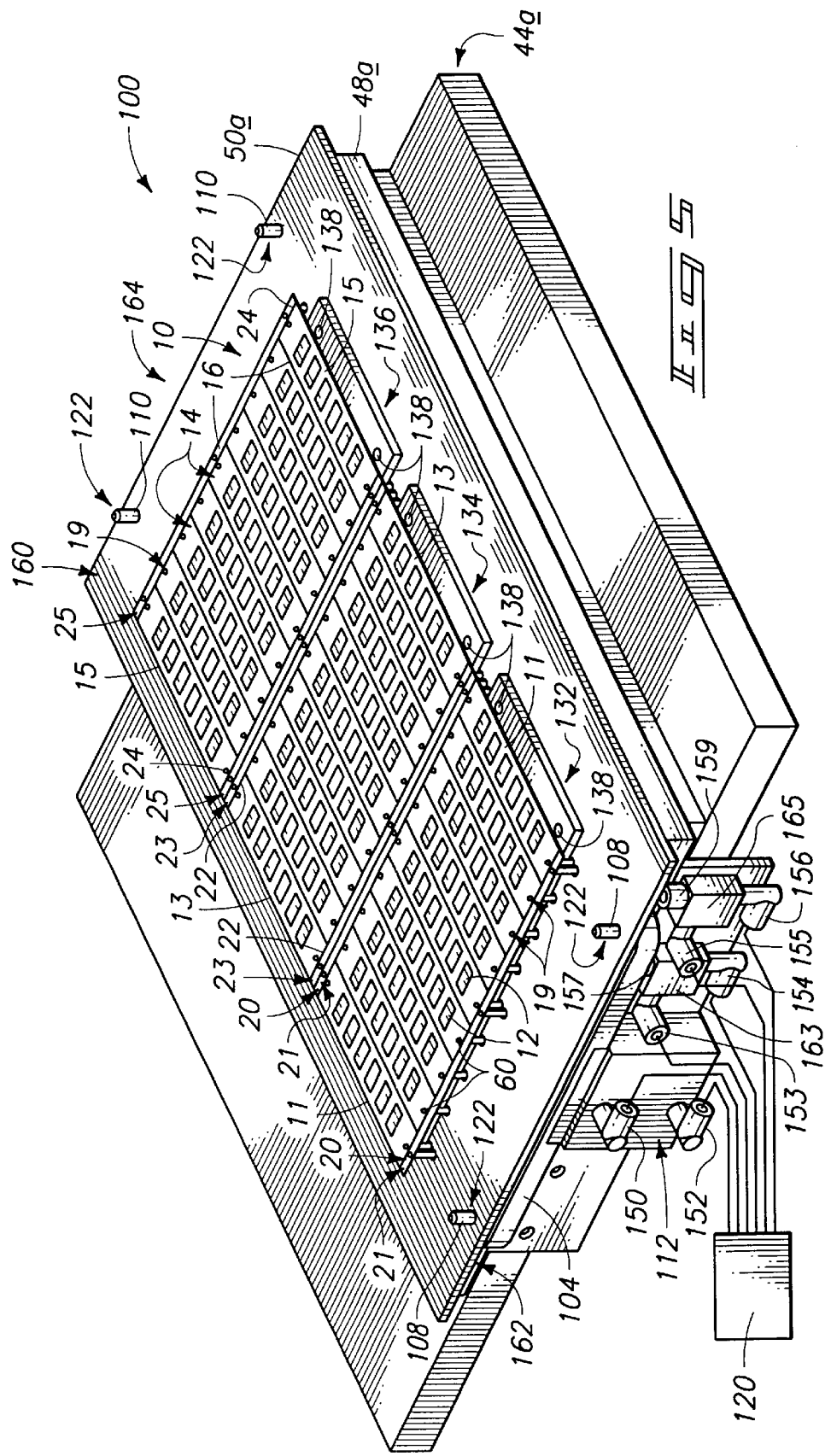
FIG. 5 is a view of the FIG. 4 assembly after the retained circuit board is cut to separate individual IC packages from one another.

Referring to FIG. 5, the individual integrated circuit packages 14 are separated from one another by cutting through boards 11, 13 and 15.

Figure 6:
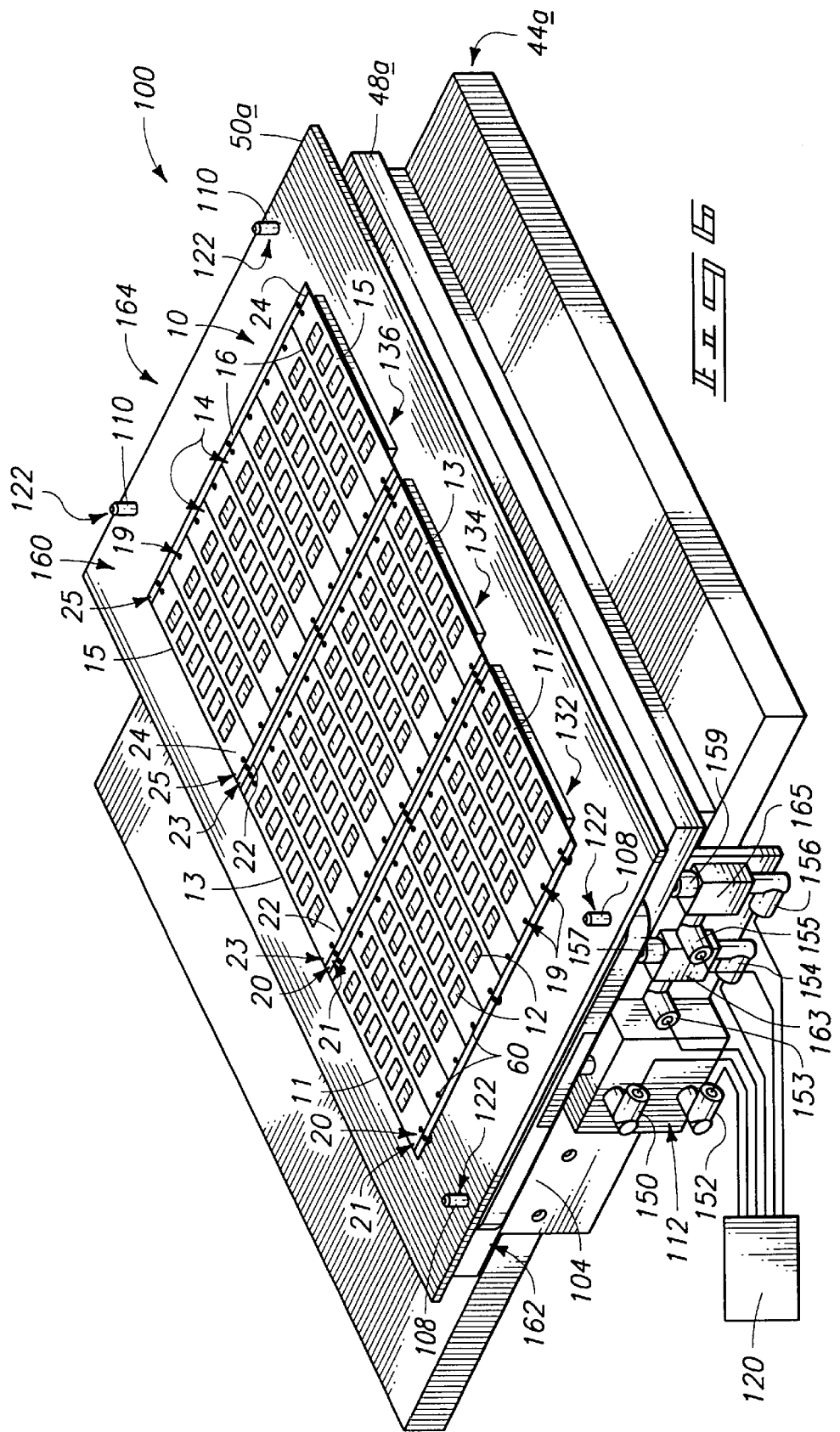
FIG. 6 is a view of the FIG. 5 assembly after a stripper plate is lifted to release separated IC packages from retaining pins.

Referring to FIG. 6, actuators 112 and 114 (FIG. 2) are utilized to vertically displace support 50*a* from base 48*a*. Preferably, such vertical displacement comprises lifting both of ends 162 and 164 of support 50*a* substantially simultaneously and substantially in unison with one another. (As used in the preceding sentence, the term "substantially" indicates that the lifting of both ends is simultaneous and in unison within operational parameters.) In exemplary applications the upper surface 160 of support 50*a* is level prior to the lifting and remains level during the lifting. The lifting of support 50*a* releases separated circuit packages 14 from pins 60. After such release, support 50*a* can be, for example, manually lifted from pins 108 and 110, and the separated packages removed from support 50*a*.

In compliance with the statute, the invention has been described in language more or less specific as to structural and methodical features. It is to be understood, however, that the invention is not limited to the specific features shown and described, since the means herein disclosed comprise preferred forms of putting the invention into effect. The invention is, therefore, claimed in any of its forms or modifications within the proper scope of the appended claims appropriately interpreted in accordance with the doctrine of equivalents.

What is claimed is:

1. An integrated circuit package separator for separating integrated circuit packages from a board comprising a plurality of integrated circuit components bonded thereto, the components extending outwardly from the board, the board having a plurality of holes extending within it, the separator comprising:

a base having a plurality of pins extending upwardly therefrom;

a support over the base and having an upper planar surface, the support having a plurality of holes extending there through and a pair of opposing ends, the pins extending through the holes and upwardly beyond the upper planar surface of the support; the support and pins being configured such that the pins extend into the holes in the board when the board is placed over the support upper planar surface;

a pair of actuators beneath the support and configured to vertically displace the support and lift the support off the pins, the actuators comprising a first actuator proximate one of said opposing ends and a second actuator proximate the other of said opposing ends;

a panel over the support;

a plurality of blocks over the panel, the blocks having upper surfaces and being configured to support the board while leaving the integrated circuit chip components extending between the block upper surfaces and the panel; and a cutting mechanism configured to cut the board while the board is over the panel and to thereby separate the integrated circuit packages from one another.

2. The separator of claim 1 wherein the pins align with the board such that each of the separated integrated circuit packages is retained to the support by at least one pin.

3. The separator of claim 1 wherein the pins align with the board such that each of the separated integrated circuit packages is retained to the support by at least two pins.

4. The separator of claim 1 wherein the actuators are pneumatically powered.

5. The separator of claim 1 wherein the actuators are coupled to the support through first and second lift members, respectively; the lift members having substantially planar upper surfaces and the base having a substantially planar upper surface, the substantially planar upper surfaces of the lift members being substantially flush with the base substantially planar upper surface.

6. The separator of claim 1 wherein the actuators are coupled to the support through first and second lift members, respectively; at least one of the lift members having at least one post extending upwardly therefrom, the at least one post extending through a hole in the support.

7. The separator of claim 1 wherein the actuators are coupled to the support through first and second lift members, respectively; the first and second lift members each having at least two posts extending upwardly therefrom, the posts extending through holes in the support.

8. The separator of claim 1 wherein the posts are tapered, the tapered posts being wider at respective lift members than above respective lift members.

9. The separator of claim 1 wherein the actuators are pneumatically powered; the actuators each comprising a pair of gas ports, one of each pair of ports being a gas inlet when the actuator lifts the support and the other port of each pair of ports being a gas outlet when the actuator lifts the support; the separator further comprising at least one pressure release valve in fluid communication with the gas outlets.

10. The separator of claim 1 wherein the actuators are pneumatically powered; the actuators each comprising a pair of gas ports, one of each pair of ports being a gas inlet when the actuator lifts the support and the other port of each pair of ports being a gas outlet when the actuator lifts the support; the separator further comprising at least two pressure release valves, one of the pressure release valves being in fluid communication with one of the gas outlets, and an other of the pressure release valves being in fluid communication with the other of the gas outlets.

11. The separator of claim 1 wherein the actuators comprise respective substantially co-planar surfaces positioned beneath respective opposing ends of the support.

12. The separator of claim 1 wherein the panel is fastened to the support.

13. The separator of claim 1 wherein the blocks are in a one-to-one correspondence with the integrated circuit packages on the board.

14. The separator of claim 1 comprising more than one panel over the support, each panel having blocks associated therewith.

15. The separator of claim 1 wherein the blocks are fastened to the panel.

16. The separator of claim 1 wherein the blocks are one-piece with the panel.

17. The separator of claim 1 wherein the pins do not extend through the panel.

18. The separator of claim 1 wherein the base comprises a substantially planar upper surface, and wherein the support defines a substantially planar upper surface over an entirety of the upper surface of the base.

19. The separator of claim 1 wherein the support is devoid of pins.

20. The separator of claim 1 wherein the panel is devoid of pins.

21. The separator of claim 1 wherein the base comprises a substantially planar upper surface terminating to define outermost lateral edges, and wherein the support defines a substantially planar upper surface over an entirety of the upper surface of the base and extending laterally beyond the outermost lateral edges of the base.

* * * * *

UNITED STATES PATENT AND TRADEMARK OFFICE
CERTIFICATE OF CORRECTION

PATENT NO. : 6,508,154 B1
DATED : January 21, 2003
INVENTOR(S) : Jason E. Tripard It is certified that error appears in the above-identified patent and that said Letters Patent is hereby corrected as shown below:

Column 2,
Line 3, please replace "adjustable S in x and y directions;" with -- adjustable in x and y directions; --

Column 5,
Line 28, please replace "chip packages 14. Also, is in the shown" with -- chip packages 14. Also, in the shown --
Line 46, please replace "154. 155 and 156 are provided between" with -- 154, 155 and 156 are provided between --
Line 47, please replace "source. 120. Valves (not shown) are" with -- source 120. Valves (not shown) are --

Column 8,
Line 6, please replace "The separator of claim 1 wherein the posts" with -- The separator of claim 7 wherein the posts --

Signed and Sealed this

Twelfth Day of August, 2003

JAMES E. ROGAN
*Director of the United States Patent and Trademark Office*

UNITED STATES PATENT AND TRADEMARK OFFICE
CERTIFICATE OF CORRECTION

PATENT NO. : 6,508,154 B1
DATED : January 21, 2003
INVENTOR(S) : Jason E. Tripard It is certified that error appears in the above-identified patent and that said Letters Patent is hereby corrected as shown below:

Column 2,
Line 4, replace "system is illustrate in a lower corner of FIG. 1). Control" with
-- system is illustrated in a lower corner of FIG. 1). Control --
Line 39, replace "stripper plate 50 is manually lifted off of subplate 42 to lift" with
-- stripper plate 50 is manually lifted off of subplate 48 to lift --

Signed and Sealed this

Twenty-eighth Day of September, 2004

JON W. DUDAS
*Director of the United States Patent and Trademark Office*